United States Patent
Tsai

(10) Patent No.: US 11,315,871 B2
(45) Date of Patent: Apr. 26, 2022

(54) INTEGRATED CIRCUIT DEVICE WITH BONDING STRUCTURE AND METHOD OF FORMING THE SAME

(71) Applicant: NANYA TECHNOLOGY CORPORATION, New Taipei (TW)

(72) Inventor: Tzu-Ching Tsai, Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 133 days.

(21) Appl. No.: 16/440,292

(22) Filed: Jun. 13, 2019

(65) Prior Publication Data
US 2020/0395295 A1    Dec. 17, 2020

(51) Int. Cl.
| | |
|---|---|
| H01L 23/522 | (2006.01) |
| H01L 23/48 | (2006.01) |
| H01L 23/532 | (2006.01) |
| H01L 23/00 | (2006.01) |
| H01L 23/528 | (2006.01) |
| H01L 25/065 | (2006.01) |
| H01L 25/00 | (2006.01) |
| H01L 21/768 | (2006.01) |

(52) U.S. Cl.
CPC .... *H01L 23/5226* (2013.01); *H01L 21/76898* (2013.01); *H01L 23/481* (2013.01); *H01L 23/5283* (2013.01); *H01L 23/53228* (2013.01); *H01L 24/09* (2013.01); *H01L 24/17* (2013.01); *H01L 25/0657* (2013.01); *H01L 25/50* (2013.01); *H01L 2224/02381* (2013.01); *H01L 2224/0401* (2013.01)

(58) Field of Classification Search
CPC .............. H01L 23/5226; H01L 23/481; H01L 23/53228; H01L 24/09; H01L 23/5283
See application file for complete search history.

(56) References Cited

U.S. PATENT DOCUMENTS

| | | | | |
|---|---|---|---|---|
| 9,520,361 | B2* | 12/2016 | Kang | H01L 27/14621 |
| 9,653,430 | B2* | 5/2017 | Kim | H01L 21/6835 |
| 9,799,587 | B2* | 10/2017 | Fujii | H01L 27/1464 |
| 9,941,243 | B2* | 4/2018 | Kim | H01L 24/08 |
| 2003/0098292 | A1* | 5/2003 | Kulkarni | H01L 21/32136 216/78 |
| 2005/0003652 | A1* | 1/2005 | Ramanathan | H01L 24/11 438/616 |

(Continued)

OTHER PUBLICATIONS

Office Action dated Mar. 19, 2020 related to Taiwanese Application No. 108127041.

*Primary Examiner* — Eugene Lee
(74) *Attorney, Agent, or Firm* — Muncy, Geissler, Olds & Lowe, P.C.

(57) ABSTRACT

An integrated circuit device includes a first substrate, a second substrate, a first expanding pad, a second expanding pad and a bonding structure. The first substrate is provided with a first conductive portion, the second substrate is provided with a second conductive portion, the first expanding pad is formed on the first conductive portion to provide a first expanded contact area, the second expanding pad is formed on the second conductive portion to provide a second expanded contact area, and the bonding structure is formed between the first substrate and the second substrate, wherein the first expanding pad is bonded to the second expanding pad.

7 Claims, 13 Drawing Sheets

(56) References Cited

U.S. PATENT DOCUMENTS

| | | | | |
|---|---|---|---|---|
| 2005/0224921 A1* | 10/2005 | Gupta | H01L 25/0657 | 257/621 |
| 2007/0145367 A1* | 6/2007 | Chen | H01L 25/50 | 257/49 |
| 2010/0007001 A1* | 1/2010 | Wang | H01L 25/0657 | 257/686 |
| 2011/0227023 A1* | 9/2011 | Bethune | H01L 27/2409 | 257/4 |
| 2011/0248396 A1* | 10/2011 | Liu | H01L 25/0657 | 257/686 |
| 2011/0291267 A1* | 12/2011 | Wang | H01L 21/76898 | 257/737 |
| 2012/0058605 A1* | 3/2012 | Fujii | H01L 21/76898 | 438/118 |
| 2012/0061827 A1* | 3/2012 | Fujita | H01L 27/0617 | 257/737 |
| 2013/0134548 A1* | 5/2013 | Torii | H01L 21/76898 | 257/508 |
| 2014/0011324 A1* | 1/2014 | Liu | H01L 24/27 | 438/107 |
| 2014/0117546 A1* | 5/2014 | Liu | H01L 23/53295 | 257/751 |
| 2015/0021785 A1 | 1/2015 | Lin | | |
| 2015/0205041 A1* | 7/2015 | Neelakantan | G02B 6/428 | 385/14 |
| 2016/0155862 A1* | 6/2016 | Hong | H01L 31/02005 | 257/432 |
| 2017/0062366 A1 | 3/2017 | Enquist | | |
| 2018/0286846 A1 | 10/2018 | Lin | | |
| 2019/0385982 A1* | 12/2019 | Lee | H01L 24/08 | |
| 2020/0373305 A1* | 11/2020 | Hsu | H01L 27/10885 | |
| 2020/0373308 A1* | 11/2020 | Tsai | H01L 27/10891 | |

* cited by examiner

INTEGRATED CIRCUIT DEVICE WITH BONDING STRUCTURE AND METHOD OF FORMING THE SAME

TECHNICAL FIELD

The present disclosure relates to an integrated circuit device and a method of forming the same, and more particularly, to an integrated circuit device with a bonding structure and a method of forming the same.

DISCUSSION OF THE BACKGROUND

Integrated circuits are broadly used in electronic devices. In the integrated circuit industry, continual reductions in minimum feature size allow more components to be integrated into a given area. A recent development is three-dimensional integrated circuits (3DICs), in which multiple semiconductor dies are stacked upon one another, using packaging techniques such as package-on-package (PoP) and system-in-package (SiP). Some 3DICs are prepared by placing dies over dies on a semiconductor wafer level. 3DICs provide improved integration density and other advantages, such as faster speeds and greater bandwidth.

While seeking ways to decrease length of interconnects between the stacked dies, alignment of two substrates becomes crucial because a poor alignment can cause misplacement of interconnects of the two substrates. For example, if a conductive portion of a substrate fails to be suitably coupled to another conductive portion of another substrate due to the poor alignment, a conductivity defect will likely occur. However, it would be inefficient to pursue perfect alignment during the semiconductor manufacturing process, since that would require a significant increase in the process time.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present invention provides an integrated circuit device including a first substrate, a second substrate, a first expanding pad, a second expanding pad and a bonding structure. In some embodiments, the first substrate is provided with a first conductive portion and the second substrate is provided with a second conductive portion. In some embodiments, the first expanding pad is formed on the first conductive portion to provide a first expanded contact area and the second expanding pad is formed on the second conductive portion to provide a second expanded contact area. In some embodiments, the bonding structure is formed between the first substrate and the second substrate, wherein the first expanding pad is bonded to the second expanding pad.

In some embodiments, the first expanding pad is substantially aligned with the second expanding pad.

In some embodiments, the first conductive portion and the second conductive portion are formed by copper, and the first expanding pad and the second expanding pad are formed by at least one of copper germanide ($Cu_3Ge$), copperfil ($Cu_3Si$) and copper-carbon cluster ($Cu_3C$).

In some embodiments, the first conductive portion and the second conductive portion are surrounded by the first expanding pad and the second expanding pad, respectively.

In some embodiments, a portion of a sidewall of the first conductive portion is in direct contact with the first expanding pad, and a portion of sidewall of the second conductive portion is in direct contact with the second expanding pad.

In some embodiments, the first conductive portion and the second conductive portion are formed by copper, and the first expanding pad and the second expanding pad are formed by plating conductive materials around the first conductive portion and the second conductive portion.

In some embodiments, the integrated circuit device further comprises a first through-substrate via formed in the first substrate and an interconnect structure formed over the first through-substrate via, wherein the first through-substrate via is between the interconnect structure and the bonding structure.

Another aspect of the present invention provides a method of forming an integrated circuit device. The method includes steps of providing a first substrate having a first conductive portion, providing a second substrate having a second conductive portion, performing a first chemical reaction to form a first expanding pad on the first conductive portion to provide a first expanded contact area, performing a second chemical reaction to form a second expanding pad on the second conductive portion to provide a second expanded contact area, and bonding the first substrate to the second substrate with a bonding structure.

In some embodiments, the method further comprises aligning the first expanding pad with the second expanding pad.

In some embodiments, the first conductive portion includes copper.

In some embodiments, the first chemical reaction includes reacting the copper with germane to obtain copper germanide, reacting the copper with silane to obtain copperfil, or reacting the copper with methane to obtain copper-carbon cluster.

In some embodiments, the method further comprises performing a chemical mechanical polishing process to expose at least a portion of a sidewall of the first conductive portion through the first substrate before performing the first chemical reaction.

In some embodiments, the first expanding pad is bonded to the second expanding pad so that the first expanded contact area is substantially in direct contact with the second expanded contact area.

In some embodiments, the method further comprises forming a first through-substrate via in the first substrate and forming an interconnect structure over the first through-substrate via.

In some embodiments, the first through-substrate via is between the interconnect structure and the bonding structure.

Another aspect of the present invention provides a method of forming an integrated circuit device. The method includes steps of providing a first substrate having a first conductive portion, providing a second substrate having a second conductive portion, performing a first plating process to form a first expanding pad on the first conductive portion to provide a first expanded contact area, performing a second plating process to form a second expanding pad on the second conductive portion to provide a second expanded contact area, and bonding the first substrate to the second substrate with a bonding structure.

In some embodiments, the first conductive portion is made of copper and the first expanding pad is nickel plated on the copper.

In some embodiments, the method further comprises aligning the first expanding pad with the second expanding pad.

In some embodiments, the first expanding pad is bonded to the second expanding pad so that the first expanded contact area is substantially in direct contact with the second expanded contact area.

In some embodiments, the method further comprises forming a first through-substrate via in the first substrate and forming an interconnect structure over the first through-substrate via, wherein the first through-substrate via is between the interconnect structure and the bonding structure.

With the above-mentioned configurations of the integrated circuit device and methods of forming the same, the conductive portions of two substrates both have respective expanding pads so that the contact area can be increased. Hence, the conductivity problems caused by poor alignment can be alleviated.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
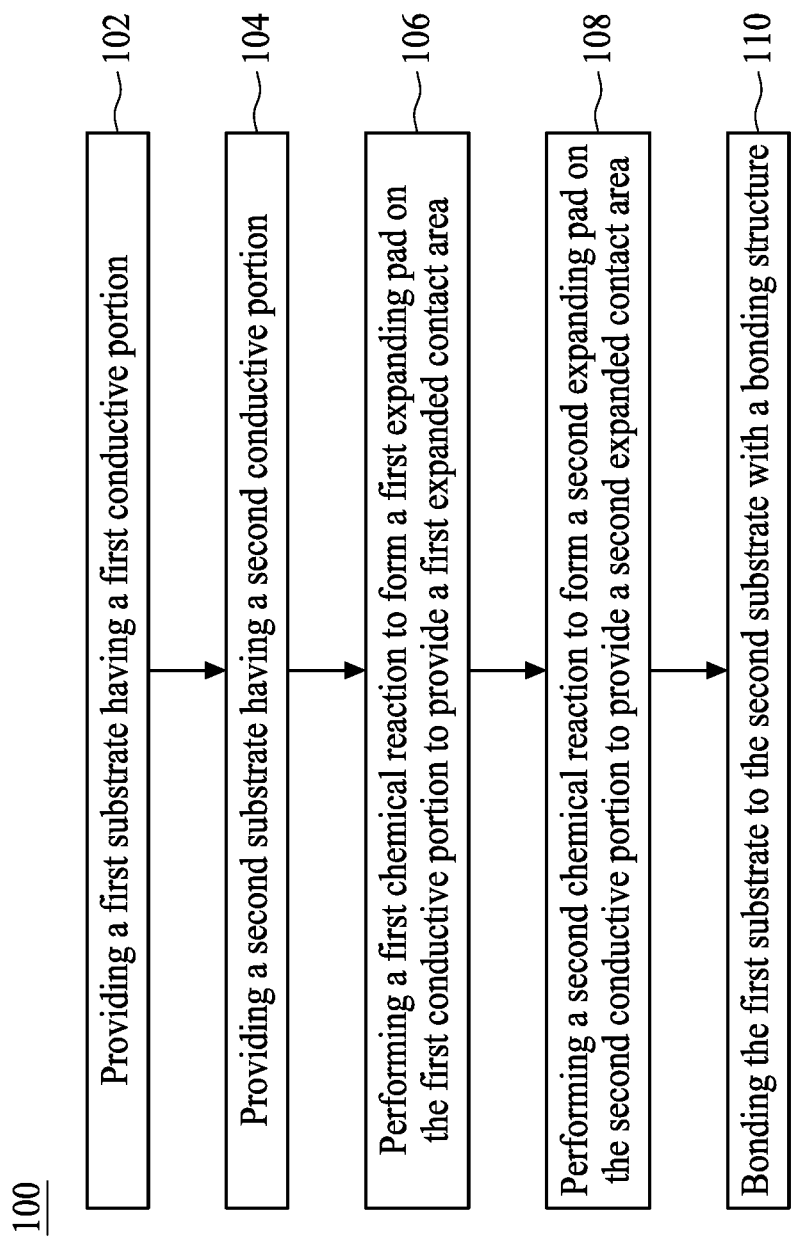
FIG. 1 is a flowchart showing a method for forming an integrated circuit provided by the first preferred embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart showing a method 100 for forming an integrated circuit in accordance with the first embodiment of the present disclosure. In some embodiments, the method 100 includes a number of steps (102, 104, 106, 108 and 110) and the description and illustrations below are not deemed as a limitation to the sequence of the steps.

Figure 2A:
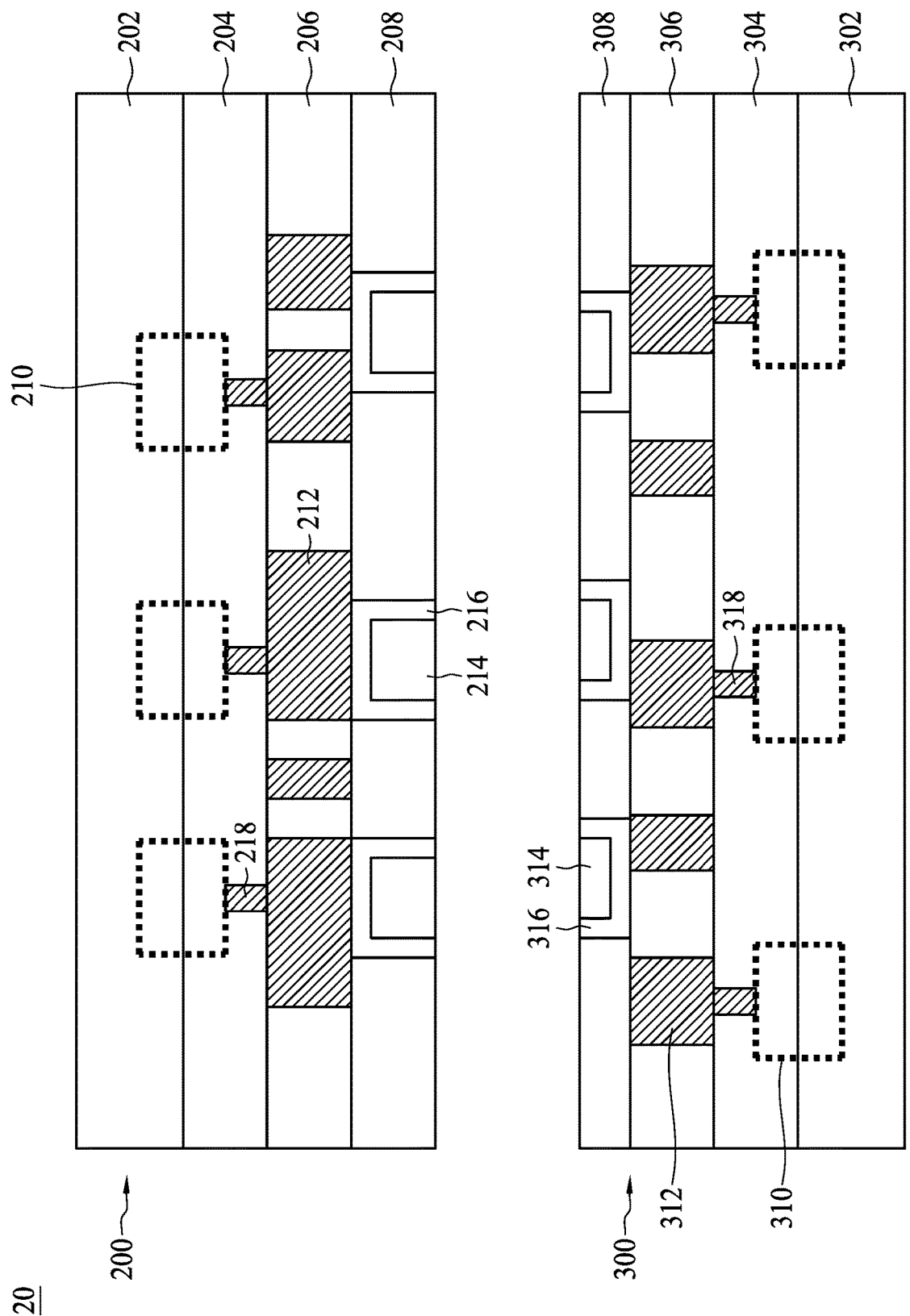
FIGS. 2A to 2F are cross-sectional illustrations of different stages of forming an integrated circuit device, in accordance with the first embodiment of the present disclosure.

FIGS. 2A to 2F are cross-sectional illustrations of different stages of forming an integrated circuit device 20 in accordance with some embodiments. Referring to FIG. 2A, a cross-sectional illustration of a portion of a first semiconductor device 200 and a portion of a second semiconductor device 300 are shown in accordance with some embodiments. In step 102, a first semiconductor substrate 202 having a first conductive portion 214 above is provided. In some embodiments, if the first conductive portion 214 is made of a metal, such as copper, which is easy to diffuse, then a diffusion barrier layer 216 is needed to prevent the metal from diffusing. The diffusion barrier layer 216 may be made of silicon nitride (SiN), silicon oxynitride (SiON), titanium nitride (TiN), tantalum nitride (TaN), or aluminum nitride (AlN). In some embodiments, the first conductive portion 214 is made of copper, and the diffusion barrier layer 216 is made of Ti, TiN, Ta, TaN, Ta/TaN, CoP or CoW. In some embodiments, diffusion barrier layer 216 has a thickness in a range from about 5 Å to about 1000 Å.

As can be seen in FIG. 2A, the first semiconductor device 200 and the second semiconductor device 300 are arranged to face each other for the subsequent bonding processes. As illustrated, the first semiconductor device 200 includes a first device region 210, and a metallization structure is formed to individually connect to the first device regions 210. The details of the first device region 210 and the metallization structure are illustrated below. In some embodiments, the metallization structure includes an interconnect structure, such as contact plugs 218 and first conductive features 212. The conductive features 212 are embedded in an insulating material 206. In some embodiments, the insulating material 206 is made of silicon oxide. In some embodiments, the insulating material 206 includes multiple dielectric layers of dielectric materials. The first conductive features 212 are connected to the first conductive portions 214 so that the first device regions 210 are also electrically connected to the first conductive portions 214. The first conductive portion 214 may be made of conductive materials, such as copper (Cu), copper alloy, aluminum (Al), aluminum alloy, or combinations thereof. Other applicable materials may be used to form the first conductive portion 214. The metallization structure shown is merely for illustrative purposes. The metallization structure may include other configurations and may include one or more conductive lines and via layers.

In some embodiments, the first semiconductor substrate 202 may be made of silicon or other semiconductor materials according to the knowledge in the field. For example, in some embodiments, the first semiconductor substrate 202 may include other elementary semiconductor materials such as germanium. In some embodiments, the first semiconductor substrate 202 is made of a compound semiconductor such as silicon carbide, gallium arsenic, indium arsenide, or indium phosphide. In some embodiments, the first semiconductor substrate 202 is made of an alloy semiconductor such as silicon germanium, silicon germanium carbide, gallium arsenic phosphide, or gallium indium phosphide. In some embodiments, the first semiconductor substrate 202 includes an epitaxial layer. For example, the first semiconductor substrate 202 has an epitaxial layer overlying a bulk semiconductor.

In step 104, a second substrate 302 having a second conductive portion 314 above is provided. In some embodiments, as shown in FIG. 2A, the second semiconductor device 300 is similar to the first semiconductor device 200. The second semiconductor device 300 includes the second semiconductor substrate 302, second device regions 310, and a metallization structure, which is formed to individually connect to the second device regions 310. The details of the second device region 310 and the metallization structure are illustrated below.

In some embodiments, the metallization structure includes an interconnect structure, such as contact plugs 318 and conductive features 312. The conductive features 312 are embedded in an insulating material 306. In some embodiments, the insulating material 306 is made of silicon oxide. In some embodiments, the insulating material 306 includes multiple dielectric layers of dielectric materials. The metallization structure shown is merely for illustrative purposes. The metallization structure may include other configurations and may include one or more conductive lines and via layers. In some embodiments, the metallization structure may further include a diffusion barrier layer 316, which is similar to the diffusion barrier layer 216.

The second semiconductor substrate 302 is similar to the first semiconductor substrate 202, and thus may also be made of silicon or other semiconductor materials according to the knowledge in the field. In some embodiments, the second semiconductor substrate 302 includes an epitaxial layer. For example, the second semiconductor substrate 302 has an epitaxial layer overlying a bulk semiconductor.

Figure 2B:
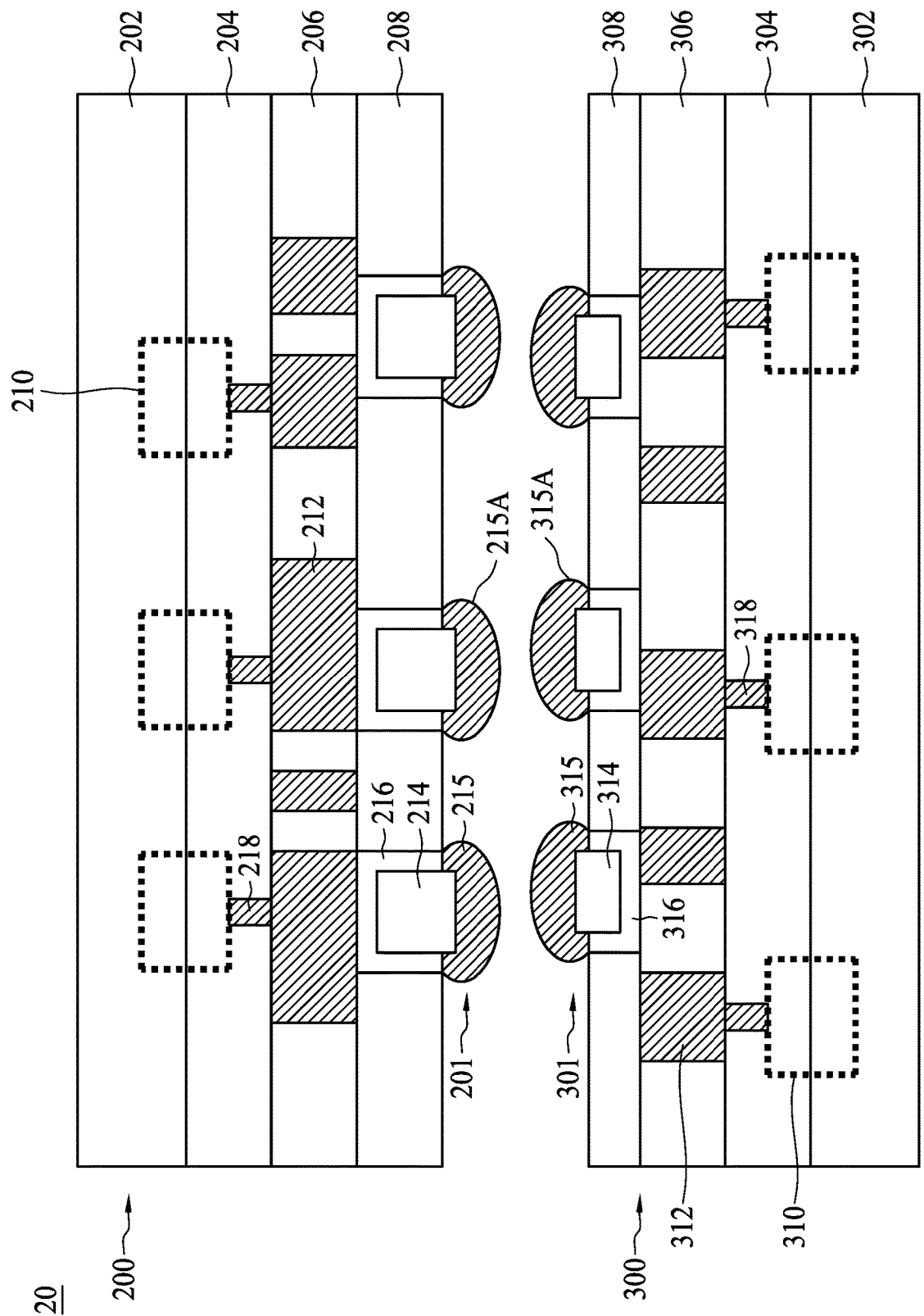

Referring to FIG. 2B, a cross-sectional illustration of a portion of the first semiconductor device 200 and a portion of the second semiconductor device 300 are shown in accordance with some embodiments. In step 106, a first chemical reaction 201 is performed to form a first expanding pad 215 on the first conductive portion 214 to provide a first expanded contact area 215A that may be, for example, 10% larger than the first conductive portion 214. In some embodiments, the first conductive portion 214 is copper, and the first chemical reaction 201 includes germanidation of copper. In order to achieve the germanidation of copper, the first substrate 202 is brought to a pre-clean temperature which is preferably equal to the soak temperature, followed by a plasma-assisted pre-clean performed in-situ at a declining pressure. The resulting germanide is a copper germanide ($Cu_3Ge$) alloy, and the first expanding pad 215 is formed. By applying an in-situ plasma-assisted clean, the native copper oxide (CuO) present on the copper film is removed before the exposure to the germanium precursor, thereby facilitating the solid vapor reaction between the copper and the germane gas. Comparative studies have shown that the in-situ plasma-assisted clean leads to better germanidation of copper having an orthorhombic crystalline as compared with an ex-situ plasma-assisted clean. In some embodiments, a chemical mechanical polishing process may be performed prior to the first chemical reaction 201. As illustrated in FIG. 2B, at least a portion of sidewalls of the first conductive portion 214 is exposed through the first polymer material 208 to facilitate the subsequent first chemical reaction 201. In some embodiments, the exposed portion of sidewalls of the first conductive portion 214 is in direct contact with the first expanding pad 215.

According to some embodiments of the present disclosure, the germanium precursor employed in the first chemical reaction 201 may be germane, e.g., $GeH_4$, supplied in the presence of a carrier gas to induce a catalyzed chemical vapor reaction. Preferably, the carrier gas is $N_2$. The flow rate of the germane precursor ($GeH_4$) can be adjusted to the desired partial pressure in the PECVD chamber where the germanidation takes place. This partial pressure of the germanium precursor in the reactor may be, for example, between 70 and 420 mTorr.

Furthermore, it has been found that the soak time, the partial pressure of the Ge precursor ($GeH_4$) and the soak temperature (also referred to as the germanidation temperature) are interrelated variables that must be selected according to the thickness of the chosen metal films. In some embodiments, the soak temperature for any of the copper (Cu), nickel (Ni) and cobalt (Co) films is maintained in the range between 250° C. and 400° C.

In some embodiments, the germanidation in the first chemical reaction 201 may be replaced with similar processes. For example, the precursor may be methane ($CH_4$) or silane ($SiH_4$) to obtain copper-carbon cluster or copper fill, respectively. Since the principle of the chemical reaction using the precursor above is similar, a detailed description of the corresponding process is thus not repeated for the sake of conciseness.

In step 108, a second chemical reaction 301 is performed to form a second expanding pad 315 on the second conductive portion 314 to provide a second expanded contact area 315A that may be, for example, 10% larger than the second conductive portion 314. In some embodiments, the second conductive portion 314 is copper, and the second chemical reaction 301 includes germanidation of copper as described above. In some embodiments, a chemical mechanical polishing process may be performed prior to the second chemical reaction 301. As illustrated in FIG. 2B, at least a portion of sidewalls of the second conductive portion 314 is exposed through the second polymer material 308 to facilitate the subsequent second chemical reaction 301. In some embodiments, the exposed portion of sidewalls of the second conductive portion 314 is in direct contact with the second expanding pad 315.

Figure 2C:
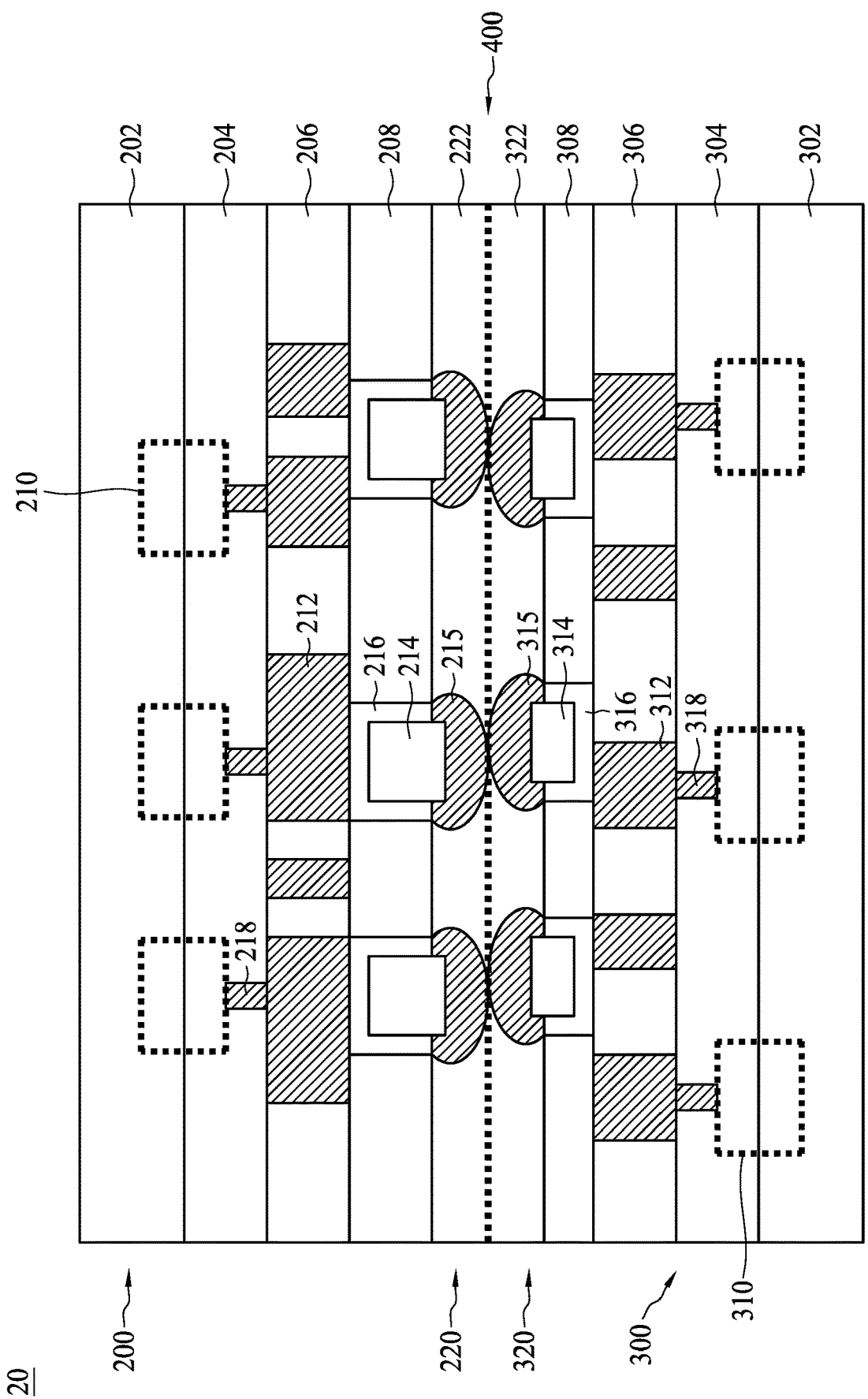

Referring to FIG. 2C, a cross-sectional illustration of a portion of the first semiconductor device 200 and a portion of the second semiconductor device 300 are shown in accordance with some embodiments. In step 110, the first substrate 202 of the first semiconductor device 200 is bonded to the second substrate 302 of the second semiconductor device 300 with a hybrid bonding structure 400 so that the first expanded contact area 215A is substantially in direct contact with the second expanded contact area 315A.

As illustrated in FIG. 2C, a first bonding structure 220 is formed over the metallization structure of the first semiconductor device 200. The first bonding structure 220 includes the first conductive portion 214 embedded in a first polymer material 208 and the first expanding pad 215 embedded in a third polymer material 222. The first conductive portion 214 may be, in some embodiments, a contact pad (or a bond pad) formed on a top surface of the first semiconductor device 200. In some embodiments, the first polymer material 208 is benzocyclobutene (BCB) polymer, polyimide (PI), or polybenzoxazole (PBO). In some embodiments, the second polymer material 222 is made of benzocyclobutene (BCB) polymer and is applied to the metallization structure by spin coating. Since benzocyclobutene polymer is a soft material, it can tolerate more stress resulting from TSV formed during the subsequent processes, compared to other dielectric materials such as silicon dioxide.

The second bonding structure 320 is similar to the first bonding structure 220 and includes the second conductive portion 314 embedded in a second polymer material 308 and the second expanding pad 315 embedded in the fourth polymer material 322. The second conductive portion 314 is similar to the first conductive portion 214, and the second and fourth polymer materials 308 and 322 are similar to the first and second polymer materials 208 and 226, respectively.

Before the first semiconductor device 200 is bonded to the second semiconductor device 300, the first and second semiconductor devices 200 and 300 are aligned, such that the first expanding pad 215 on the first conductive portion 214 can be bonded to the second expanding pad 315 on the second conductive portion 314 and the third polymer material 222 on the first semiconductor device 200 can be bonded to the fourth polymer material 322 on the second semiconductor device 300. In some embodiments, the alignment of the first and second semiconductor devices 200 and 300 may be achieved by using an optical sensing method. As illustrated, with the first and second expanding pads 215 and 315, it is not necessary for the alignment to be perfect, but a fine bonding result can still be achieved.

Referring to FIG. 2C, after the alignment is performed, the first and second semiconductor devices 200 and 300 are bonded together by hybrid bonding to form a 3DIC stacking structure 20 (die stack). The first and second semiconductor devices 200 and 300 are hybrid bonded together by the application of pressure and heat. In some embodiments, during hybrid bonding, the stacking structure 20 is heated to a temperature in a range from about 100° C. to about 200° C., such that the polymer materials 208, 222, 308 and 322 become a non-confined viscous liquid and are reflowed. By reflowing the polymer materials 208, 222, 308 and 322, voids therein are eliminated.

Next, the stacking structure 20 is further heated to a higher temperature in a range from about 220° C. to about 380° C., such that the expanding pads 215 and 315 are interconnected by thermocompression bonding and the polymer materials 208, 222, 308 and 322 are fully cured. In some embodiments, the pressure for hybrid bonding is in a range from about 0.7 bar to about 10 bar. The hybrid bonding process may be performed in an inert environment, such as an environment filled with inert gas including $N_2$, Ar, He, or combinations thereof.

As shown in FIG. 2C, hybrid bonding involves at least two types of bondings, including metal-to-metal bonding and non-metal-to-non-metal bonding. As shown in FIG. 2C, the hybrid bonding structure 400 is formed between the first and second semiconductor devices 200 and 300. The hybrid bonding structure 400 includes the expanding pads 215 and 315 bonded by metal-to-metal bonding and the polymer materials 222 and 322 bonded by non-metal-to-non-metal bonding. As shown in FIG. 2C, the bonding structure 400 has a metallic bonding interface between the expanding pads 215 and 315 but may not have a clear non-metallic interface between the polymer materials 222 and 322 due to the reflowing process.

Compared to hybrid bonding involving other dielectric layers, the first and second semiconductor devices 200 and 300 are bonded through the polymer materials 222 and 322. Since the bonding of the polymer materials 222 and 322 involves the reflowing of the polymer materials 222 and 322, voids in the polymer materials 222 and 322 are eliminated and bonding strength of the first and second semiconductor devices 200 and 300 is improved.

Figure 2D:
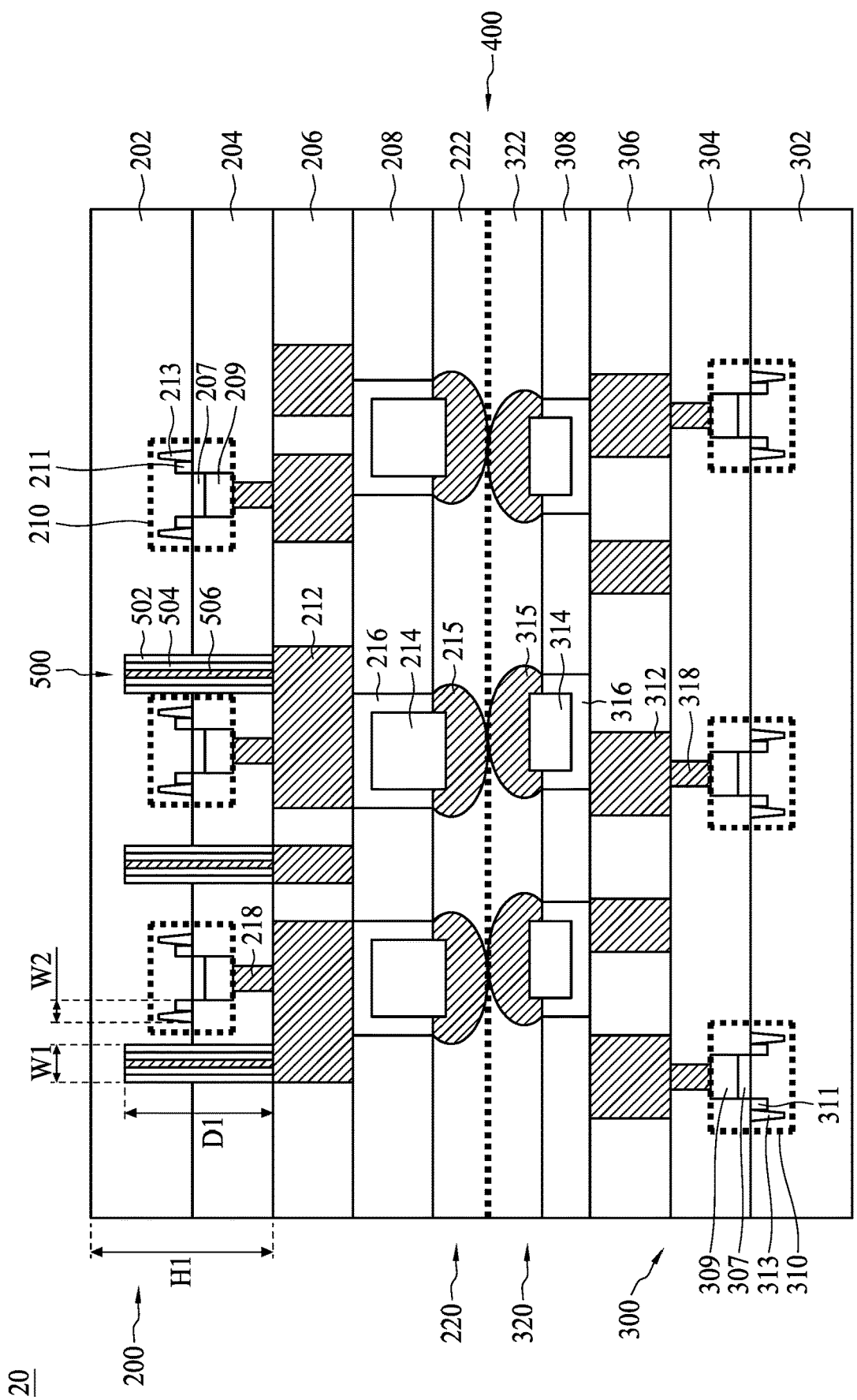

Referring to FIG. 2D, a cross-sectional illustration of a portion of the first semiconductor device 200 and a portion of the second semiconductor device 300 are shown in accordance with some embodiments. As illustrated, each of the first device regions 210 includes a gate structure embedded in a dielectric layer 204, source/drain regions 211, and isolation structures 213, such as shallow trench isolation (STI) structures. The gate structure includes a gate dielectric layer 207, a gate electrode 209, and optional spacers (not shown). The first device regions 210 shown in FIG. 2D are merely examples, and other structures may be formed in the device regions 210. In some embodiments, the first device regions 210 may form various N-type metal-oxide semiconductor (NMOS) and/or P-type metal-oxide semiconductor (PMOS) devices, such as transistors or memories, and the like, which are interconnected to perform one or more functions. Other devices, such as capacitors, resistors, diodes, photo-diodes, fuses, and the like may also be formed on the substrate 202.

As shown in FIG. 2D, through silicon vias (TSVs) 500 are provided on the first semiconductor substrate 202 and the metallization structure is formed over the TSVs 500 to individually connect the TSVs 500 to the device regions 210. As illustrated, the TSVs 500 are formed between two adjacent device regions 210 and extend into substrate 202. The TSVs 500 are used to provide electrical connections and for heat dissipation for 3DICs. Although FIG. 2D shows three TSVs, the number of TSVs may be adjusted according to actual application.

As shown in FIG. 2D, each of the TSVs 500 includes a liner 502, a diffusion barrier layer 504, and a conductive material 506 in accordance with some embodiments. In some embodiments, the liner 502 is made of an insulating material, such as an oxide or a nitride. The liner 502 may be formed using a plasma-enhanced chemical vapor deposition (PECVD) process or other applicable process. The liner 502 may be a single layer or multi-layers. In some embodiments, the liner 502 has a thickness in a range from about 100 Å to about 5000 Å.

In some embodiments, the diffusion barrier layer 504 is made of Ta, TaN, Ti, TiN, or CoW. In some embodiments, the diffusion barrier layer 504 is formed by a physical vapor deposition (PVD) process. In some embodiments, the conductive material 506 is made of copper (Cu), copper alloy, aluminum (Al), aluminum alloy, or combinations thereof. Alternatively, other applicable materials may be used. In some embodiments, the conductive material 506 is formed by plating.

With high aspect ratios, filling materials into the TSV opening becomes challenging. Voids may form in a TSV opening. In addition, due to insufficient sidewall coverage of the liner 502 or the diffusion barrier layer 504, some extrusion or diffusion problems related to the conductive material 506 may occur. In contrast, as shown in FIG. 2D, the TSVs 500 are designed to have a depth D1 less than a height H1 of the first semiconductor device 200. Therefore, the void problems and the extrusion or diffusion problems related to the conductive material 506 are resolved or greatly reduced. In addition, a width W1 of the TSVs 500 is reduced along with a decrease of the depth D1 of the TSVs 500. When a distance W2 is smaller, a larger area of device regions 210 may be used. As a result, integrated density of the devices in device regions 210 is further improved.

In some embodiments, the first semiconductor device 200 has a height H1 from a bottom surface of the first semiconductor substrate 202 to a top surface of the gate structure in a range from about 1 μm to about 20 μm. In some embodiments, the TSVs 500 have a width W1 in a range from about 0.025 μm to about 2 μm. In some embodiments, the TSVs 500 have a depth D1 in a range from about 0.2 μm to about 10 μm. In some embodiments, the TSVs 500 have an aspect ratio (D1/W1) in a range from about 2 to about 15. In addition, devices in the vicinity of the TSV suffer from serious performance degradation due to stress induced by the TSV. A keep-out zone (KOZ) is used to define a region in which no devices may be placed. In some embodiments, the keep-out zone (KOZ) is defined by a distance W2, which is measured from a sidewall of the TSV 500 to a nearest gate structure. Since the depth D1 of the TSVs 500 is reduced, a smaller width W1 is achieved. Therefore, overall stress induced by the TSVs 500 is reduced. In some embodiments, the distance W2 is in a range from 0.01 μm to about 3 μm. In some embodiments, when the width W1 of the TSVs 500 is reduced to a range from about 2 μm to about 3 μm, the stress induced by the TSV can thus almost be ignored.

Similarly, as shown in FIG. 2D, the second semiconductor device 300 is similar to the first semiconductor device 200. The second semiconductor device 300 includes a second substrate 302 and second device regions 310. The second substrate 302 is similar to the first substrate 202. The second device regions 310 are similar to the first device regions 210 and include a gate structure, source/drain regions 311, and isolation structures 313. The gate structure of the second device region 310 is similar to the gate structure of the first device region 210 and includes a gate dielectric layer 307, a gate electrode 309, and optional spacers (not shown). The gate dielectric layer 307 is similar to the gate dielectric layer 207, and the gate electrode 309 is similar to the gate electrode 209. In addition, the source/drain regions 311 in the second device regions 310 are similar to the source/drain regions 211 in the first device regions 210, and the isolation structures 313 in the second device regions 310 are similar to the isolation structures 213 in the first device regions 210.

Figure 2E:
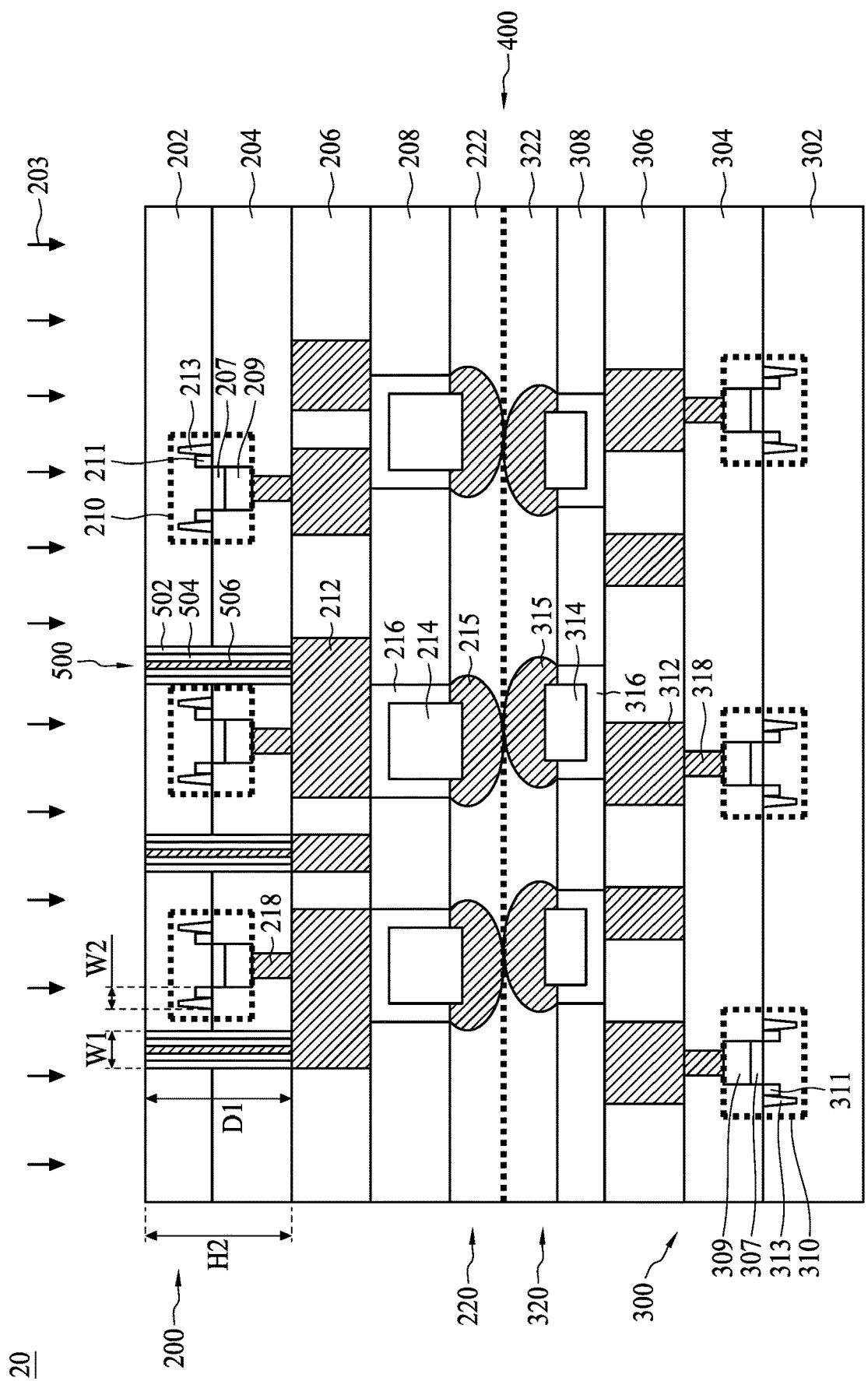

Referring to FIG. 2E, a cross-sectional illustration of a portion of the first semiconductor device 200 and a portion of the second semiconductor device 300 are shown in accordance with some embodiments. As illustrated, after hybrid bonding, the stacking structure 20 is put on a tape (not shown) and a thinning process 203 is performed on a bottom surface of the first semiconductor device 200. After the thinning process 203, the TSVs 500 are exposed. The thinning process 203 may include a grinding operation and a polishing operation (such as chemical mechanical polishing (CMP)). After the thinning process 203, a wet etching operation is performed to remove the defects formed on the bottom surface of the first semiconductor device 200. In some embodiments, a bottom portion of the diffusion barrier layer 504 is removed to expose the conductive material 506 by the thinning process 203. Therefore, after the thinning process 203, a height H2 is less than the depth D1. In some embodiments, the TSVs 500 have an aspect ratio (H2/W2) in a range from about 2 to about 15. In some other embodiments, the height H2 is equal to the depth D1. After the thinning process 203, the first semiconductor device 200 has a height H2 from the bottom surface of the first semiconductor substrate 202 to a top surface of the gate structure in a range from about 0.2 μm to about 10 μm. The height H2 is less than the height H1. In some embodiments, the height H2 is in a range from about 1% to about 99% of the height H1.

It should be noted that if the thinning process 203 is performed before the first and second semiconductor devices 200 and 300 are bonded, the thin first semiconductor device 200 can easily break during subsequent processes. However, if the first and second semiconductor devices 200 and 300 are bonded first, as shown in FIG. 2E, such bonding enables the thinning of the first semiconductor device 200. As a result, the first semiconductor device 200 can be thinned to a relatively smaller height H2 compared to the first semiconductor device 200, which is directly thinned before bonding.

Figure 2F:
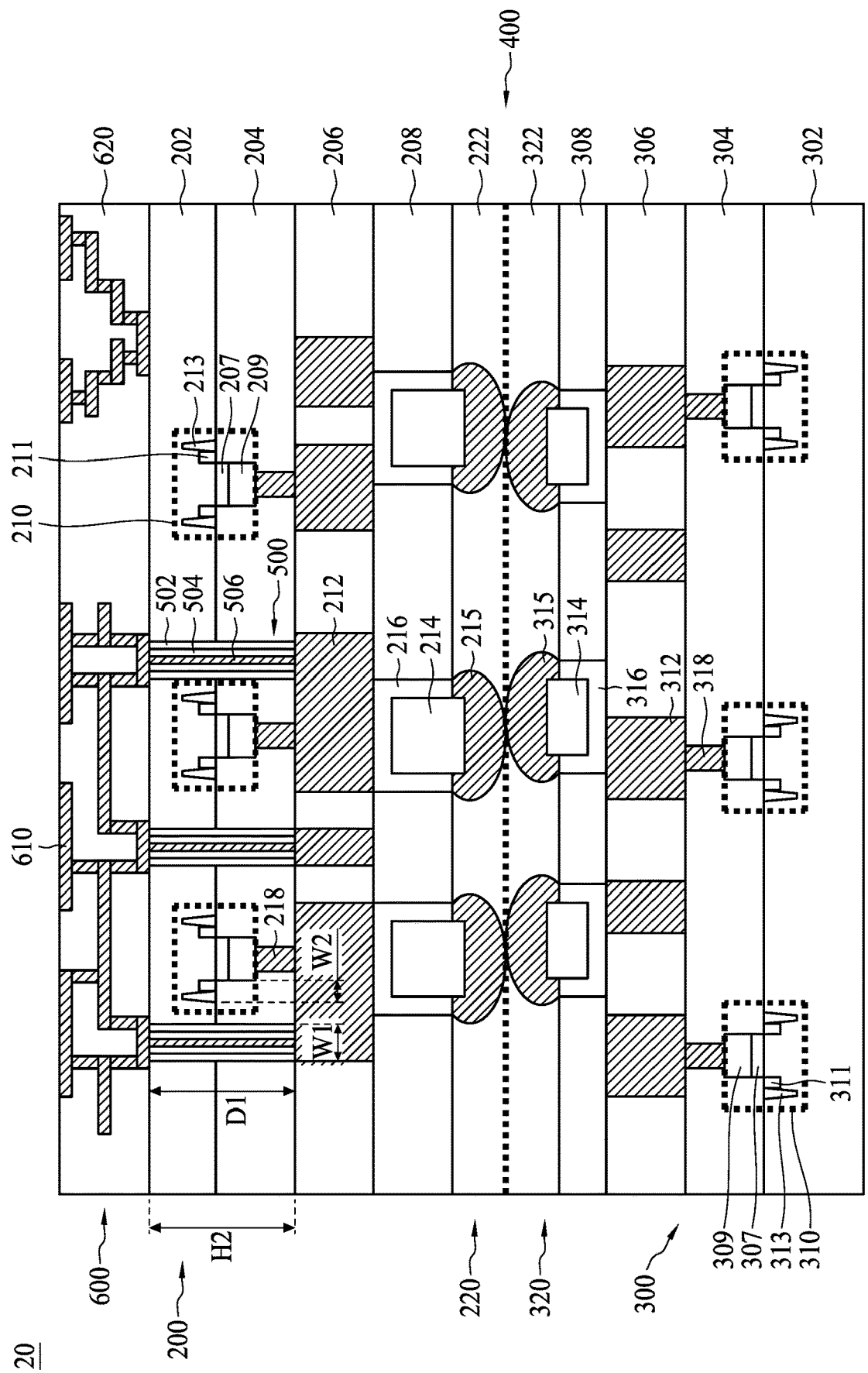

Referring to FIG. 2F, a cross-sectional illustration of a portion of the first semiconductor device 200 and a portion of the second semiconductor device 300 are shown in accordance with some embodiments. As illustrated, an interconnect structure 600 is formed on the bottom surface of the first semiconductor device 200. The interconnect structure 600 is electrically connected to conductive features 212 over the first substrate 202 via TSVs 500. The interconnect structure 600 includes conductive features 610, such as conductive lines, vias, or conductive pads, formed in an insulating material 620. The metal routing of the conductive features shown in FIG. 2F is merely an example. Alternatively, other metal routing designs of conductive features may be used according to actual application.

After forming of the interconnect structure 600, one or more redistribution layers (RDLs) (not shown) may be formed over the interconnect structure 600. For example, the redistribution layers (RDLs) are embedded in a passivation layer. An interconnect structure 500, the redistribution layers (RDLs) and the TSVs 500 provide electrical interconnection. In addition, since the TSVs 500 have a relatively low resistance, RC delay is reduced. In addition, other processes may also be performed on the 3DIC stacking structure 20, and the 3DIC stacking structure 20 may be subsequently diced to form individual chips.

Figure 3:
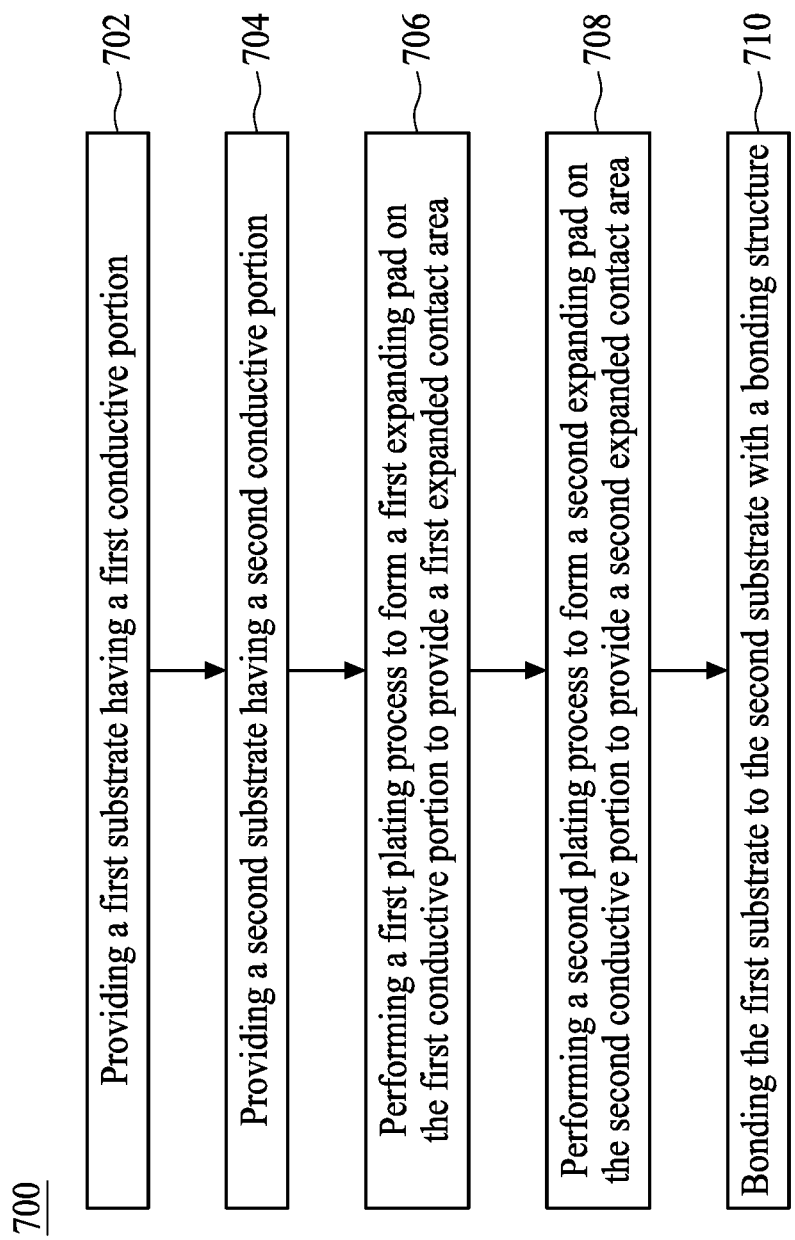
FIG. 3 is a flowchart showing a method for forming an integrated circuit provided by the second preferred embodiment.

FIG. 3 is a flowchart showing a method 700 for forming an integrated circuit in accordance with the second embodiment of the present disclosure. In some embodiments, the method 700 includes a number of steps (702, 704, 706, 708 and 710) and the description and illustrations below are not deemed as a limitation to the sequence of the steps. Steps 702 and 704 are substantially identical to steps 102 and 104 described above. In step 702, a first semiconductor substrate 202 having a first conductive portion 214 above is provided. In step 704, a second substrate 302 having a second conductive portion 314 above is provided.

Figure 4A:
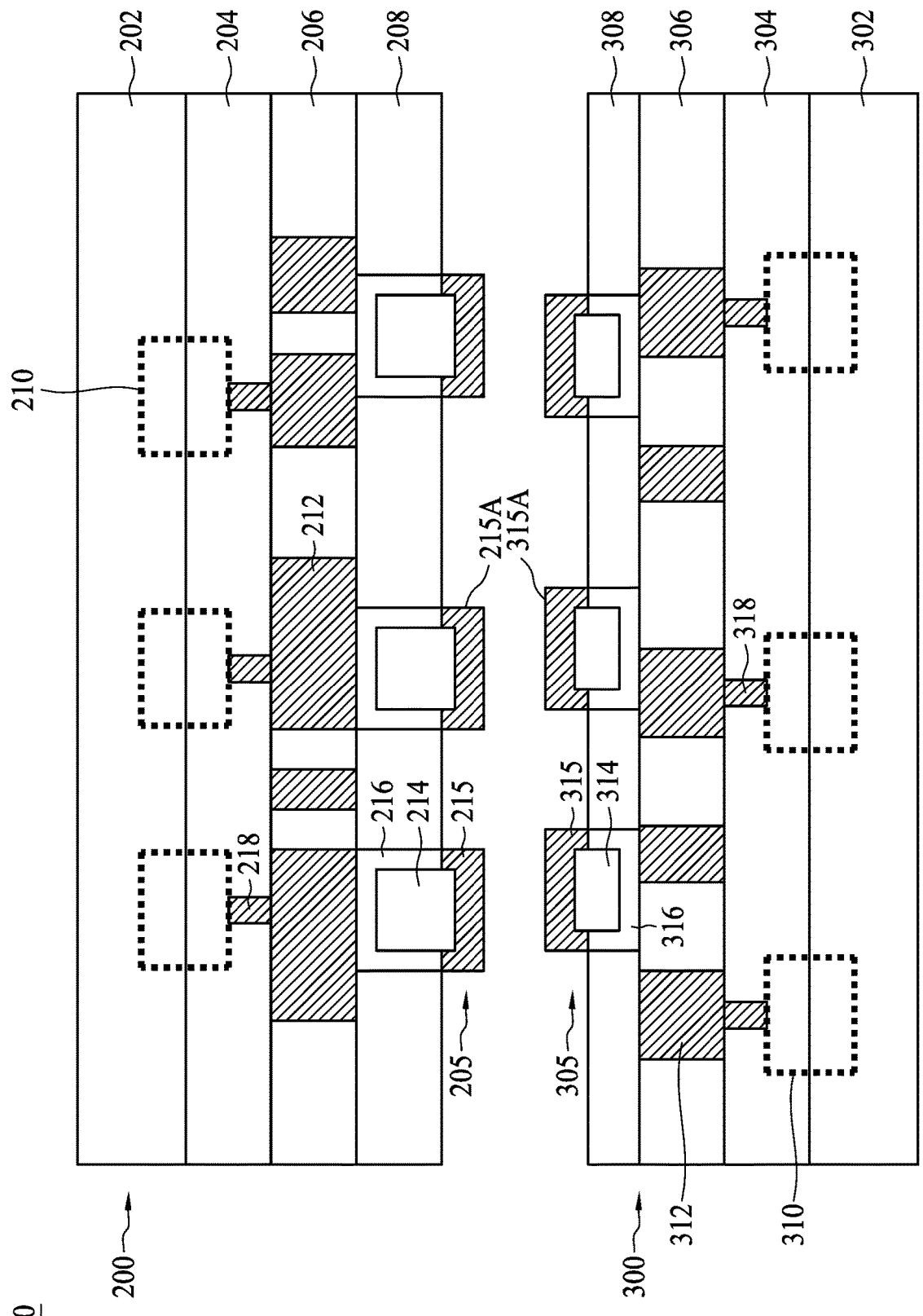
FIGS. 4A to 4E are cross-sectional illustrations of different stages of forming an integrated circuit device, in accordance with the second embodiment of the present disclosure.

FIGS. 4A to 4E are cross-sectional illustrations of different stages of forming an integrated circuit device 40 in accordance with some embodiments. Referring to FIG. 4A, a cross-sectional illustration of a portion of a first semiconductor device 200 and a portion of a second semiconductor device 300 are shown in accordance with some embodiments. In step 706, a first plating process 205 is performed to form a first expanding pad 215 on the first conductive portion 214 to provide a first expanded contact area 215A that may be, for example, 10% larger than the first conductive portion 214. In some embodiments, a chemical mechanical polishing process may be performed prior to the first plating process 205. As illustrated in FIG. 4A, at least a portion of sidewalls of the first conductive portion 214 is exposed through the second substrate 202 to facilitate the subsequent plating process.

In step 708, a second plating process 305 is performed to form a second expanding pad 315 on the second conductive portion 314 to provide a second expanded contact area 315A that may be, for example, 10% larger than the second conductive portion 314. In some embodiments, a chemical mechanical polishing process may be performed prior to the second chemical reaction 301. As illustrated in FIG. 4A, at least a portion of sidewalls of the second conductive portion 314 is exposed through the second substrate 302 to facilitate the subsequent plating process.

Figure 4B:
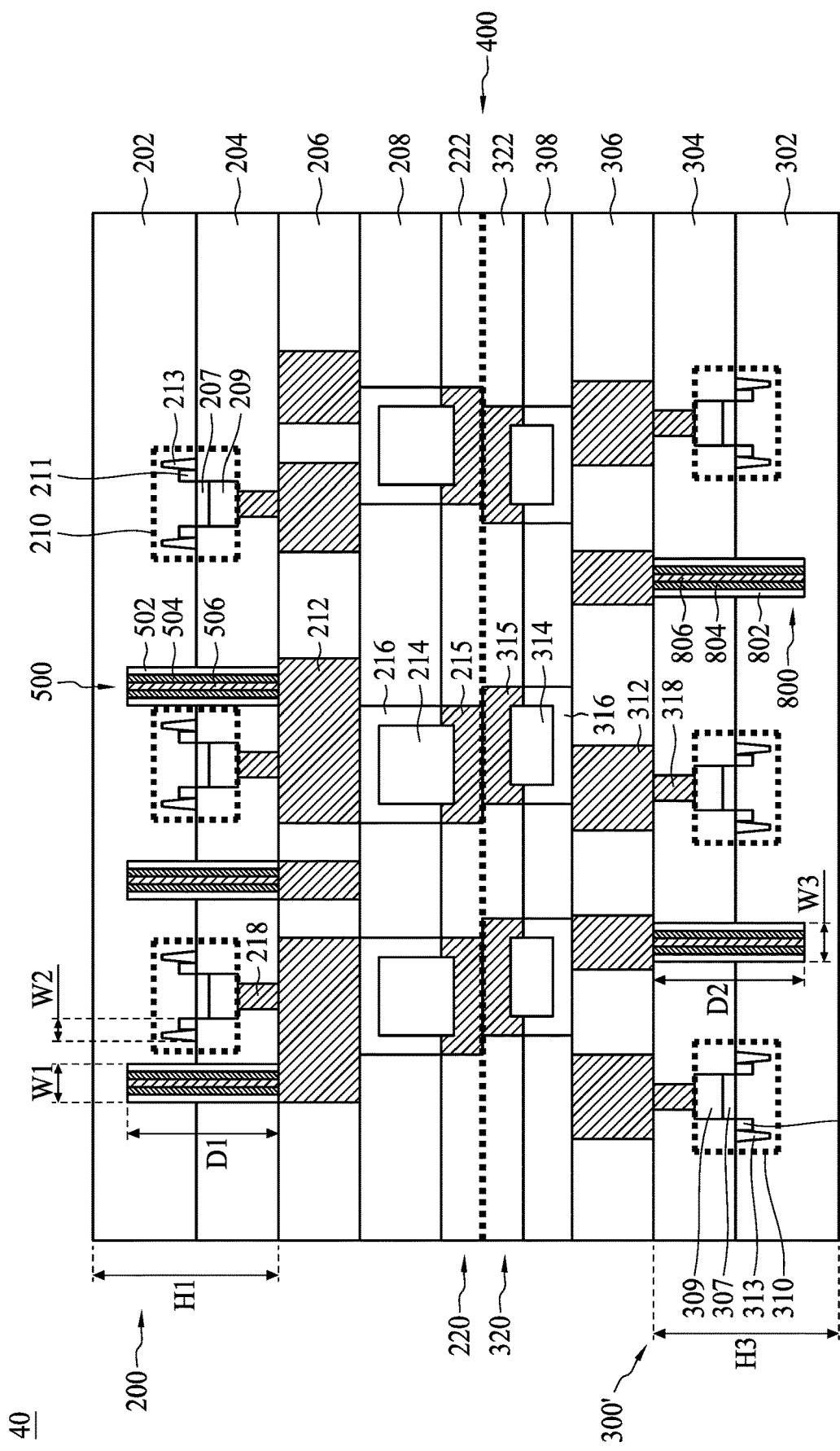

Referring to FIG. 4B, a cross-sectional illustration of a portion of a first semiconductor device 200 and a portion of a second semiconductor device 300' are shown in accordance with some embodiments. In step 710, the first substrate 202 of the first semiconductor device 200 is bonded to the second substrate 302 of the second semiconductor device 300 with a hybrid bonding structure 400. As illustrated, a 3DIC stacking structure 40 is formed by bonding the first and second semiconductor devices 200 and 300'. As shown in FIG. 4B, the second semiconductor device 300' is almost the same as the second semiconductor device 300 except that TSVs 800 are formed in the second semiconductor device 300'. In some embodiments, the TSVs 500 have a diameter different from that of the TSVs 800. In some embodiments, the formation of the TSVs 800 involves additional patterning and etching processes. In some embodiments, a quantity of the TSVs 500 is greater than that of the TSVs 800. In some other embodiments, the quantity of the TSVs 500 is less than that of the TSVs 800.

As shown in FIG. 4B, each of the TSVs 800 includes a liner 802, which is similar to the liner 502, a diffusion barrier layer 804, which is similar to the diffusion barrier layer 504, and a conductive material 806, which is similar to the conductive material 506. The TSVs 800 extend to a metal pad 312 of the second semiconductor device 300'. Because the second semiconductor device 300' is later thinned to expose the TSVs 800, the TSVs 800 do not extend through the whole substrate 302 of the second semiconductor device 300'. Therefore, the TSVs 800 are designed to have a depth D2 which is less than an original height H3 of the second semiconductor device 300'.

In some embodiments, the second semiconductor device 300' has a height H3 from a bottom surface of the second semiconductor substrate 302 to a top surface of gate structure in a range from about 17 µm to about 100 µm. In some embodiments, the TSVs 800 have a width W3 in a range from about 0.3 µm to about 10 µm. In some embodiments, the TSVs 800 have a depth D2 in a range from about 15 µm to about 100 µm. In some embodiments, the TSVs 800 have an aspect ratio (D2/W3) in a range from about 5 to about 15. In some embodiments, the depth D1 is the same as the depth D2. In some other embodiments, the depth D1 is different from the depth D2.

Figure 4C:
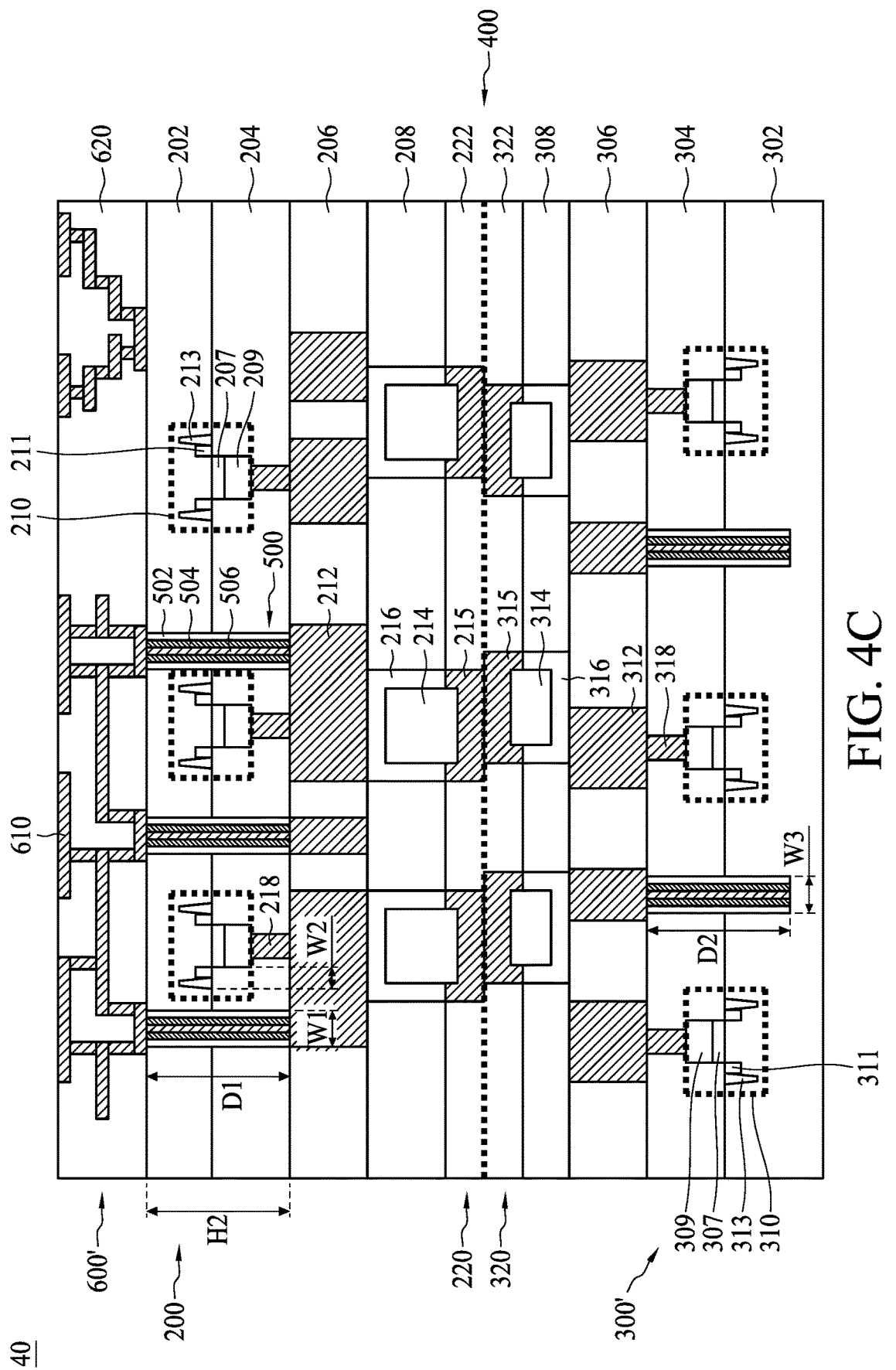

Referring to FIG. 4C, a cross-sectional illustration of a portion of a first semiconductor device 200 and a portion of a second semiconductor device 300' are shown in accordance with some embodiments. As illustrated, the first semiconductor device 200 is thinned to a height H2 and an interconnect structure 600' is formed on a bottom surface of the first semiconductor device 200. The interconnect structure 600' is similar to the interconnect structure 600 in FIG. 2F, and detailed description of the interconnect structure 600' is not repeated for brevity.

Figure 4D:
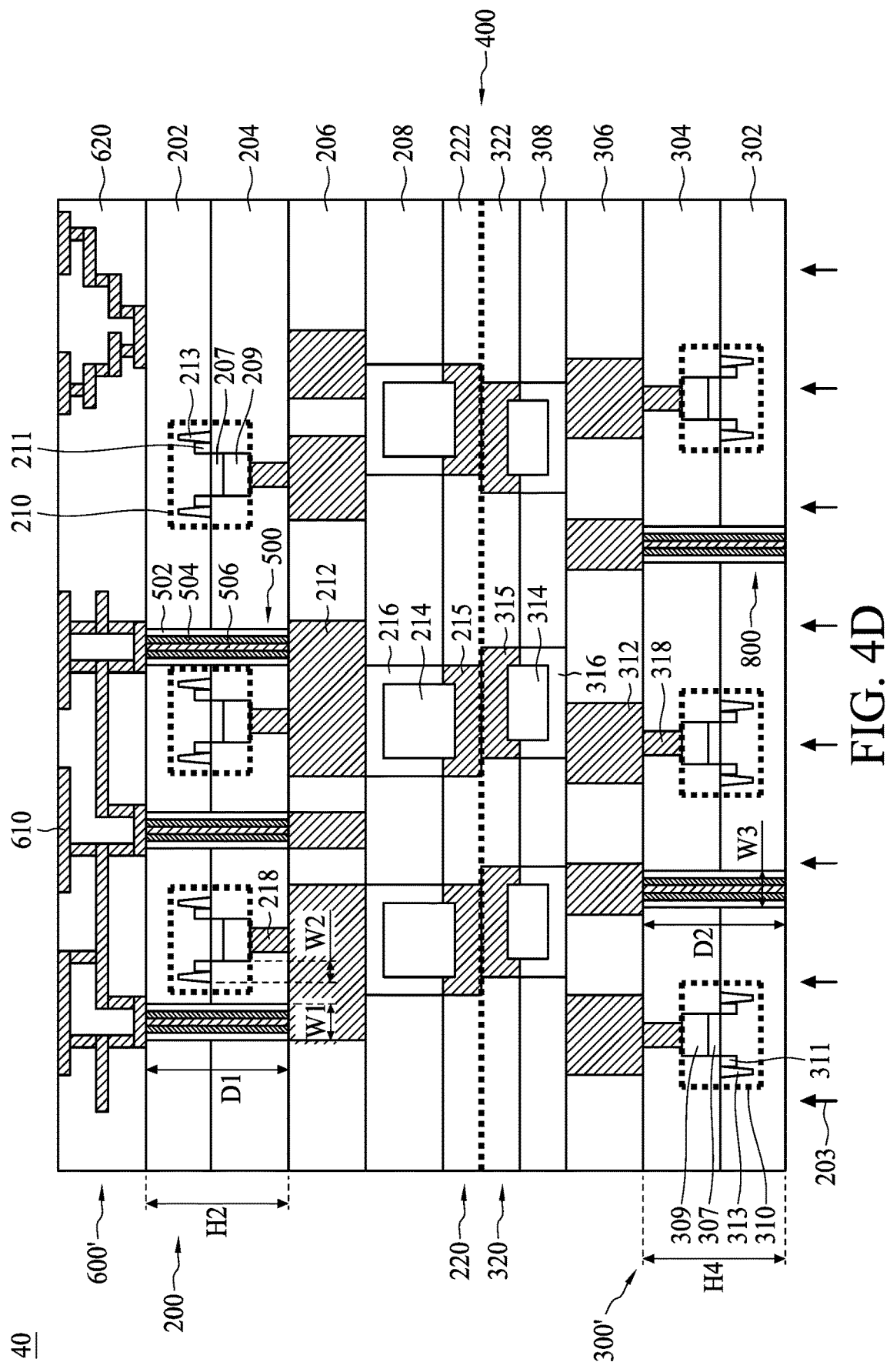

Referring to FIG. 4D, after the forming of the interconnect structure 600, the stacking structure 40 is put on a tape (not shown) and a thinning process 203 is performed on a bottom surface of the second semiconductor device 300'. After the thinning process 203, the TSVs 800 are exposed. The thinning process 203 is described above and is not repeated for brevity. After the thinning process 203, the second semiconductor device 300' has a height H4 from the bottom surface of the second semiconductor substrate 302 to a top surface of the gate structure in a range from about 15 µm to about 100 µm. The height H4 is less than the height H3. In some embodiments, the height H4 is equal to or less than depth D2.

Figure 4E:
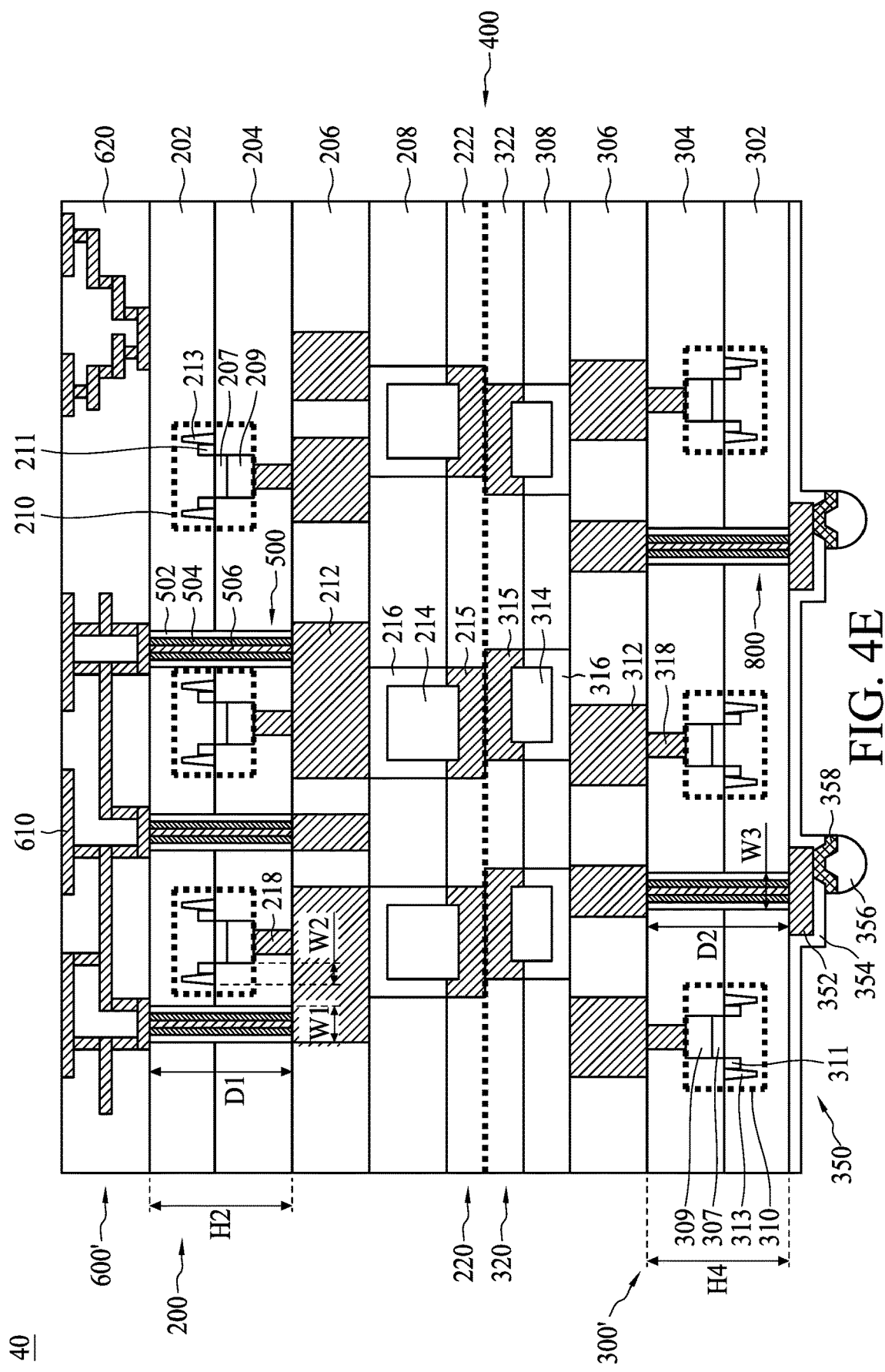

Referring to FIG. 4E, a redistribution (RDL) structure 350 is formed on a bottom surface of the second substrate 302. The RDL structure 350 includes a metal pad 352 formed in a passivation layer 354. The metal pad 352 is electrically connected to the exposed TSVs 800. The metal pad 352 is made of conductive materials with low resistivity, such as copper (Cu), aluminum (Al), Cu alloys, Al alloys, or other applicable materials. Although FIG. 4E only shows one RDL structure 350, more than one RDL structure may be formed based on requirements.

As illustrated, an under bump metallization (UBM) layer 358 is formed on the metal pad 352, and a conductive element 356 (such as a solder ball) is formed over the UBM layer 358. The UBM layer 358 may contain an adhesion layer and/or a wetting layer. In some embodiments, the UBM layer 358 is made of titanium (Ti), titanium nitride (TiN), tantalum nitride (TaN), tantalum (Ta), or the like. In some embodiments, the UBM layer 358 further includes a copper seed layer. In some embodiments, the conductive element 356 is made of conductive materials with low resistivity, such as solder or solder alloy. Exemplary elements included in the solder alloy include Sn, Pb, Ag, Cu, Ni, Bi or combinations thereof.

In some embodiments, the interconnect structure 600' is electrically connected to another package (not shown) on the backside of the second semiconductor device 300' via the TSVs 800, the RDL structure 350 and the conductive element 356. The TSVs 500 and 800 individually perform different functions. The first semiconductor device 200 is electrically connected to another package structure (not shown) via the interconnect structure 600' and the TSVs 500. The second semiconductor device 300' is electrically connected to another package structure (not shown) via the interconnect structure 600' and the TSVs 800. The TSVs 500 and 800 provide a fast conductive path to connect the first semiconductor device 200, the second semiconductor device 300, and/or other package structures, without the formation of complicated metal routings.

With the above-mentioned configurations of the integrated circuit device and methods of forming the same, the conductive portions of two substrates both have respective expanding pads so that the contact area can be increased. Hence, the conductivity problems caused by poor alignment can be alleviated.

One aspect of the present invention provides an integrated circuit device including a first substrate, a second substrate, a first expanding pad, a second expanding pad and a bonding structure. In some embodiments, the first substrate is provided with a first conductive portion and the second substrate is provided with a second conductive portion. In some embodiments, the first expanding pad is formed on the first conductive portion to provide a first expanded contact area and the second expanding pad is formed on the second conductive portion to provide a second expanded contact area. In some embodiments, the bonding structure is formed between the first substrate and the second substrate, wherein the first expanding pad is bonded to the second expanding pad.

Another aspect of the present invention provides a method of forming an integrated circuit device. The method includes steps of providing a first substrate having a first conductive portion, providing a second substrate having a second conductive portion, performing a first chemical reaction to form a first expanding pad on the first conductive portion to provide a first expanded contact area, performing a second chemical reaction to form a second expanding pad on the second conductive portion to provide a second expanded contact area, and bonding the first substrate to the second substrate with a bonding structure.

Another aspect of the present invention provides a method of forming an integrated circuit device. The method includes steps of providing a first substrate having a first conductive portion, providing a second substrate having a second conductive portion, performing a first plating process to form a first expanding pad on the first conductive portion to provide a first expanded contact area, performing a second plating process to form a second expanding pad on the second conductive portion to provide a second expanded contact area, and bonding the first substrate to the second substrate with a bonding structure.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. An integrated circuit device, comprising:
a first semiconductor device provided with a first diffusion barrier layer and a first conductive portion surrounded by the first diffusion barrier layer;
a second semiconductor device provided with a second diffusion barrier layer and a second conductive portion surrounded by the second diffusion barrier layer;
a first expanding pad formed on the first conductive portion to provide a first expanded contact area;
a second expanding pad formed on the second conductive portion to provide a second expanded contact area;
a bonding structure formed between the first semiconductor device and the second semiconductor device, wherein the first expanding pad is bonded to the second expanding pad;
a first polymer material surrounding the first diffusion barrier layer, wherein a least a portion of the first conductive portion is exposed through the first polymer material, and the portion of the first conductive portion is in direct contact with the first expanding pad; and
a second polymer material surrounding the second diffusion barrier layer, wherein at least a portion of the second conductive portion is exposed through the second polymer material, and the portion of the second conductive portion is in direct contact with the second expanding pad;
wherein the first expending pad and the second expending pad are formed by at least one of copper germanide ($Cu_3Ge$), copper silicide ($Cu_3Si$) and copper-carbon cluster ($Cu_3C$).

2. The integrated circuit device of claim 1, wherein the first expanding pad is substantially aligned with the second expanding pad.

3. The integrated circuit device of claim 2, wherein the first conductive portion and the second conductive portion are formed by copper.

4. The integrated circuit device of claim 2, wherein the first conductive portion and the second conductive portion are surrounded by the first expanding pad and the second expanding pad, respectively.

5. The integrated circuit device of claim 4, wherein a portion of a sidewall of the first conductive portion is in direct contact with the first expanding pad, and a portion of a sidewall of the second conductive portion is in direct contact with the second expanding pad.

6. The integrated circuit device of claim 1, wherein the first conductive portion and the second conductive portion are formed by copper, and the first expanding pad and the second expanding pad are formed by plating conductive materials around the first conductive portion and the second conductive portion.

7. The integrated circuit device of claim 1, further comprising a first through-substrate via formed in the first semiconductor device and an interconnect structure formed over the first through-substrate via, wherein the first through-substrate via is between the interconnect structure and the bonding structure.

* * * * *